2,988,464
Patented June 13, 1961

2,988,464

METHOD OF MAKING TRANSISTOR HAVING THIN BASE REGION

Morton E. Jones, Richardson, Tex., assignor to Texas Instruments Incorporated, Dallas, Tex., a corporation of Delaware No Drawing. Filed Sept. 29, 1958, Ser. No. 763,787
6 Claims. (Cl. 148—1.5)

This invention relates to improved methods of making semiconductor devices, and more particularly to improved methods of making transistor bars having extremely thin base regions.

Heretofore, methods have been proposed for obtaining transistor bars of silicon or germanium made by remelt techniques wherein a semiconductor body doped with two different impurities capable of imparting opposite conductivity types to the semiconductor is first melted and then cooled. Utilizing these methods, an n-p-n barrier can be produced by taking advantage of the differences in segregation coefficients of the impurities to obtain the resegregation effect. This effect is explained in detail in the process described by W. O. Pfann in the Journal of Metals for February 1954, pages 294 et seq.

It is an object of the present invention to provide an improved method for making semiconductor devices having thinner base regions than can be obtained by prior methods.

It is another object of the present invention to provide an improved method of making semiconductor devices utilizing, in a unique and novel manner, the difference in diffusion rates of selected impurities contained in a body of semiconductor material.

It is still another object of the present invention to provide an improved method of making semiconductor devices by a remelt technique wherein p and n junctions are formed in the unmelted portion of a body of semiconductor material by diffusion of carefully selected contained impurities.

These and other objects of the invention are obtained by the method to be described hereafter. Essentially, this method starts with an appropriately doped silicon or germanium bar which is remelted from the emitter end and is then rapidly cooled. The bar is then placed in a furnace at less than the remelt temperature to obtain the desired solid state diffusion. This yields a semiconductor bar with a remarkably thin base region.

In the present process, a semiconductor bar is utilized to start with which may have been cut from a grown diffused silicon crystal, for example. This bar has a thin base region at the central portion and collector and emitter regions at the two ends. In the collector end of the bar may be an n-dope to yield a resistivity of 1 ohm-centimeter. The remainder of the bar may contain an n-dope and a p-dope in heavy quantities. For example, the bar may contain boron as the p-dope and arsenic as the n-dope. The original grown diffused crystal from which the bar is cut is provided with about three times as much emitter dope in it as is usually required in a grown diffused crystal, since in processing the bar, in accordance with the principles of the present invention, only about a third of the emitter dope will get into the solid regions first regrown after melting due to segregation during regrowth. Although the bar is selected from a grown diffused crystal, this is only typical since double doped crystals and other like sources may be drawn upon to obtain a transistor bar having two p-n junctions.

The collector end of the bar described is mounted in a heat sink, which may be a large block of copper or the like which has a relatively large thermal capacity. The other end of the bar is then brought into contact with a heater, which may be in the form of a flat tungsten ribbon through which an electric current is passed. The bar is heated until it melts down beyond the original two p-n junctions. The heat sink cools the bottom portion of the bar remote from the heater and prevents the entire bar from melting. After a very short time, say one second, the heater is removed and the mass of molten liquid having the two impurities therein is permitted to grow back onto the unmelted collector portion. The cooling is very rapid.

The bar is next put in a furnace at a lower temperature, say 1100° C., until the desired diffusion has been accomplished.

The boron, the p-dope, diffuses faster than the arsenic and thus by running ahead, cause the formation of a very thin base region, much thinner than that in the original bar made by the grown diffused technique.

It is seen that using this process, the resulting bar has both of its p-n junctions in that portion of the bar which was not remelted but remained solid throughout the processing. The diffusion takes place into the unmelted collector region which initially contained no p-dope.

This is to be contrasted with previously proposed remelt techniques relying upon segregation effects wherein the original bar has both p and n dopes in it, and by remelting and regrowing the bar, one of the two dopes may be made to predominate, and by a change in the rate of growth, the other impurity may be made to predominate. In this prior method, the base region is in the remelted portion of the bar.

By contrast, utilizing the present invention, the advantage is taken of the differences in the diffusion rates of the contained impurities, and solid state diffusion takes place into the unmelted collector end forming the two p-n junctions. The resulting base region is much thinner than in the original bar.

The use of any and all types of semiconductor materials is within the contemplation of the presention invention. Thus silicon, germanium, semiconductor alloys such as indium antimonide and other similar materials may be used. If silicon is used, it is preferred to work toward an n-p-n transistor device although p-n-p devices are not to be precluded. If germanium is used, the production of a p-n-p transistor device is more desirable, but again, an n-p-n device is not to be precluded.

For silicon typical dope or impurity combinations for the base and emitter regions for an n-p-n device are boron-arsenic and aluminum-arsenic. For germanium typical dope or impurity combinations for the base and emitter regions for a p-n-p device are arsenic-gallium and antimony-gallium.

The temperatures and times for the diffusion step following remelt and regrowth are well known in the art to be from about 1000° C. to about 1300° C. for silicon and from about 600° C. to about 850° C. for germanium. Diffusion may continue for any desired duration such as for about 15 minutes to about 24 hours.

As mentioned previously the initial bar should contain about 3 times the emitter dope normally used since there will be a segregation effect upon remelt and regrowth. If a dope or impurity other than boron is used in the base region, there will also be a segregation of the base impurity and extra dope or impurity will have to be incorporated into the base region of the original bar. In the specific example given in the foregoing sufficient boron and arsenic are incorporated into the original silicon bar in the base and emitter regions, respectively, to yield a concentration in the final desired product of $10^{16}$ to $10^{17}$ atoms of boron per cubic centimeter in the base region and $10^{18}$ to $10^{19}$ atoms of arsenic per cubic centimeter in the emitter region. Typical specifice concentrations would be $3 \times 10^{16}$ atoms of boron per cubic centimeter in the base region and $5 \times 10^{18}$ atoms of arsenic per cubic centimeter in the emitter region.

It will be obvious to those skilled in the art that various changes may be made without departing from the spirit of the invention and therefore the invention is not limited to what is described in the specification, but only as indicated in the appended claims.

What is claimed is:

1. A process of making a diffused junction semiconductor device comprising melting back a longitudinal portion of a semiconductor bar having spaced p-n junctions by applying heat to one end of said bar to melt through said p-n junctions, cooling said melted portion until it has resolidified by regrowing onto the unmelted portion of said bar, and heating said semiconductor bar to cause impurities in the regrown portion of said bar to diffuse into the unmelted portion of said bar to form spaced p-n junctions entirely within said unmelted portion.

2. A process in accordance with claim 1 wherein the semiconductor bar comprises a material selected from the group consisting of silicon, germanium and semiconducting alloys.

3. A process of making a diffused junction semiconductor device comprising melting back a longitudinal portion of a semiconductor bar having spaced p-n junctions by applying heat to one end of said bar to melt through said p-n junctions, said junctions defining a collector portion, an emitter portion and a base portion intermediate thereof, said heat being applied to said emitter portion of said bar while said collector portion is maintained in its solid state at a temperature below its melting point, cooling the melted portion until it has regrown on the unmelted portion, and thereafter heating said bar to a temperature sufficient to cause impurities in the regrown portion of said bar to diffuse into the unmelted collector portion to form a pair of spaced parallel p-n rectifying barriers entirely within the unmelted collector portion of the bar.

4. A process in accordance with claim 3 wherein said collector portion is mounted in a heat sink and during the heating step heat is extracted through said heat sink to prevent melting of said collector portion.

5. The process of making a semiconductor device as defined in claim 3 wherein said semiconductor comprises silicon and said impurities comprise boron and arsenic.

6. The process of making a semiconductor device as defined in claim 3 wherein said semiconductor comprises germanium and said impurities comprise arsenic and gallium.

References Cited in the file of this patent

UNITED STATES PATENTS 2,817,608 Pankove -------------- Dec. 24, 1957

OTHER REFERENCES

Hunter: "Handbook of Semiconductor Electronics," McGraw Hill, New York, 1956. Pages 7–9 to 7–17.

"Redistribution of Solutes by Formation and Solidification of a Molten Zone," Pfann. Journal of Metals, vol. 6, 1954, p. 294–297.